US005103129A

United States Patent [19]

Slayton et al.

[11] Patent Number: 5,103,129

[45] Date of Patent: Apr. 7, 1992

[54] FIXED ORIGIN BIPLANE ULTRASONIC TRANSDUCER

[75] Inventors: Michael H. Slayton; William V. Harrison, Jr., both of Tempe, Ariz.

[73] Assignee: Acoustic Imaging Technologies Corporation, Phoenix, Ariz.

[21] Appl. No.: 558,573

[22] Filed: Jul. 26, 1990

[51] Int. Cl.[5] .......... H01L 41/08

[52] U.S. Cl. .......... 310/335; 310/334

[58] Field of Search .......... 310/334-337, 310/366-369; 73/624-626; 367/155, 164; 128/24 A, 328, 660.01, 661.01

[56] References Cited

U.S. PATENT DOCUMENTS

| | | | |
|---|---|---|---|
| 3,369,199 | 2/1968 | Sittig | 310/334 X |
| 4,398,116 | 8/1983 | Lewis | 310/334 |
| 4,477,892 | 10/1984 | Tosima et al. | 310/334 |
| 4,564,980 | 1/1986 | Diepers | 310/334 X |
| 4,570,488 | 2/1986 | Miwa et al. | 73/626 |
| 4,865,042 | 9/1989 | Umemura et al. | 310/335 X |
| 4,870,867 | 10/1989 | Shaulov | 310/334 X |
| 4,888,861 | 12/1989 | Day | 310/335 X |

*Primary Examiner*—Mark O. Budd

*Attorney, Agent, or Firm*—Christie, Parker & Hale

[57] ABSTRACT

An ultrasonic transducer has two intersecting linear arrays defining a cross shaped transducer assembly having four arms and an intersecting area. A plurality of transverse grooves form transducer elements in the arms. Coaxial transducer elements are formed in the intersecting area. Each transducer element has its signal electrode on a common side of the transducer. One or both of the intersecting linear arrays may be curved along its longitudinal axis thus allowing the transducer to be mounted on cylindrical or spherical surfaces.

40 Claims, 10 Drawing Sheets

Fig. 9a
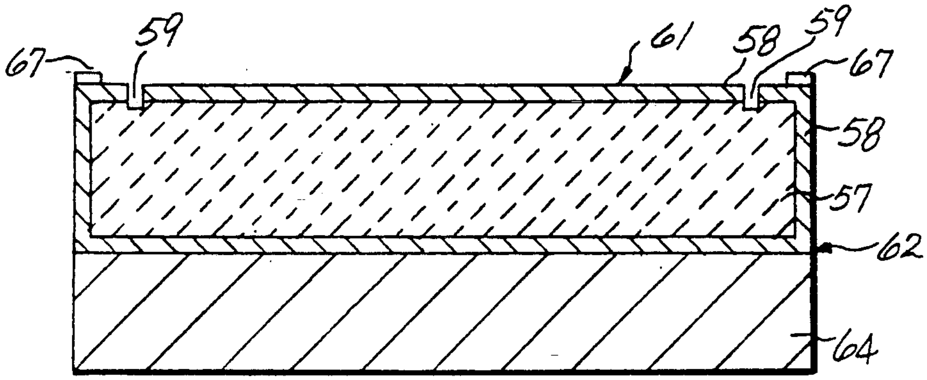
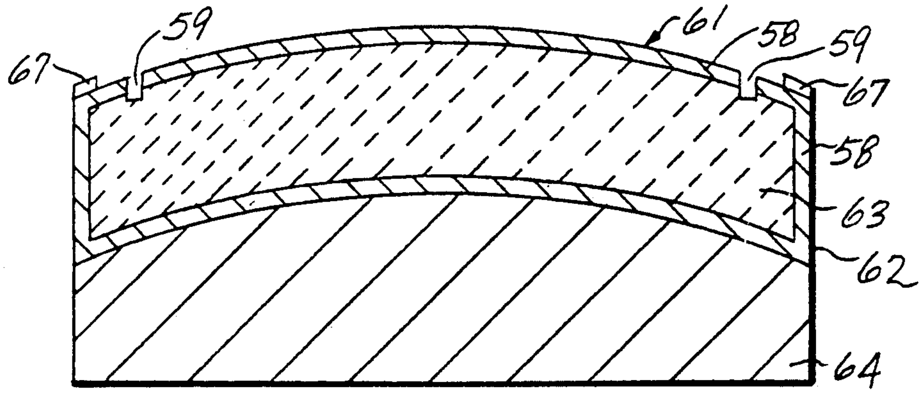
Fig. 9b

FIXED ORIGIN BIPLANE ULTRASONIC TRANSDUCER

FIELD OF THE INVENTION

The present invention relates generally to fixed origin biplane transducers and more particularly to biplane transducer structures having intersecting arrays wherein the transducer elements of each of the arrays are formed on the same side of the transducer.

BACKGROUND OF THE INVENTION

Biplane ultrasonic linear and curved linear arrays have been applied in medical diagnostic imaging for several years. A biplane transducer array has the advantage of scanning a subject in two planes without having to use separate transducer probes. Typically, the arrays are mounted on a cylindrical probe wherein the curved linear array is mounted around a partial circumference of the probe and the regular (or straight) linear array is mounted along the probes longitudinal axis adjacent to the curved linear array. Arrays such as these are often used for endorectal and endovaginal imaging because of their small size and the expanded image field of the curved array.

The problem is that the scans of the two arrays in the transducer are originated from separate locations on the probe. Accordingly, to achieve two-dimensional images either the arrays or the object being scanned must be moved. This results in a loss of reference, a reduction of the accuracy of the measurements and decreased diagnostic ability.

U.S. Pat. No. 4,870,867 to Shaulov discloses an ultrasonic transducer which permits linear scanning along two intersecting planes. The two intersecting linear arrays are formed by partially dicing the opposite faces of a cross shaped transducer plate. Therefore, the transducer element electrodes for one of the arrays are formed on one side of the transducer plate and the electrodes for the other array are formed on the opposite side of the transducer plate.

The configuration disclosed in the Shaulov patent presents several drawbacks. First, capacitive coupling between the body and the non-grounded electrode create excessive noise in the image. Accordingly, the image produced by one of the two linear arrays is necessarily more noisy than the image produced by the other since the electrodes for the two arrays are formed on opposite sides of the transducer. Second, the array cannot be curved since the intersecting area between the two linear arrays has elements cut in orthogonal relation. Third, the array would have to be so small to fit onto an endorectal or endovaginal probe as to make the array non-functional.

SUMMARY OF THE INVENTION

The present invention provides an ultrasonic transducer featuring two intersecting linear arrays. The transducer defines a cross shaped piezoelectric plate, comprised of an elongated rectangular piezoelectric plate and a pair of smaller rectangular piezoelectric plates located perpendicular and on opposite edges of the rectangular plate, sandwiched between a ground electrode and a signal electrode. A plurality of grooves extend down into the signal electrode and the piezoelectric material thereby defining a plurality of individual transducer elements. The transducer elements in both arrays have their signal electrode on the same side of the piezo material.

One or both of the intersecting linear arrays may be curved along its longitudinal axis thus allowing the transducer to be mounted on cylindrical or spherical surfaces.

The intersecting arrays forming the cross shaped transducer define a substantially square shaped intersecting area and four rectangular shaped arms. The grooves in the arms are transverse to the lengths of the arms thus defining transverse transducer elements and the grooves in the intersecting area are arranged coaxially defining coaxial transducer elements. The intersecting area is further divided into four electrically isolated quadrants by a pair of diagonally intersecting grooves extending from opposite corners of the intersecting area, each quadrant thus laying adjacent to one of the four arms and each quadrant having a plurality of transducer sub-elements disposed therein.

The coaxial transducer elements define a variety of shapes in the various embodiments of the present invention.

BRIEF DESCRIPTION OF THE DRAWINGS

These and other features and advantages of the present invention will be better understood by reference to the following detailed description when considered in conjunction with the accompanying drawings wherein:

FIG. 9*a* is a sectional view of a flat transducer plate bonded to a support layer;

FIG. 9*b* is a sectional view of a curved transducer plate bonded to a support layer;

DETAILED DESCRIPTION

Figure 1A:
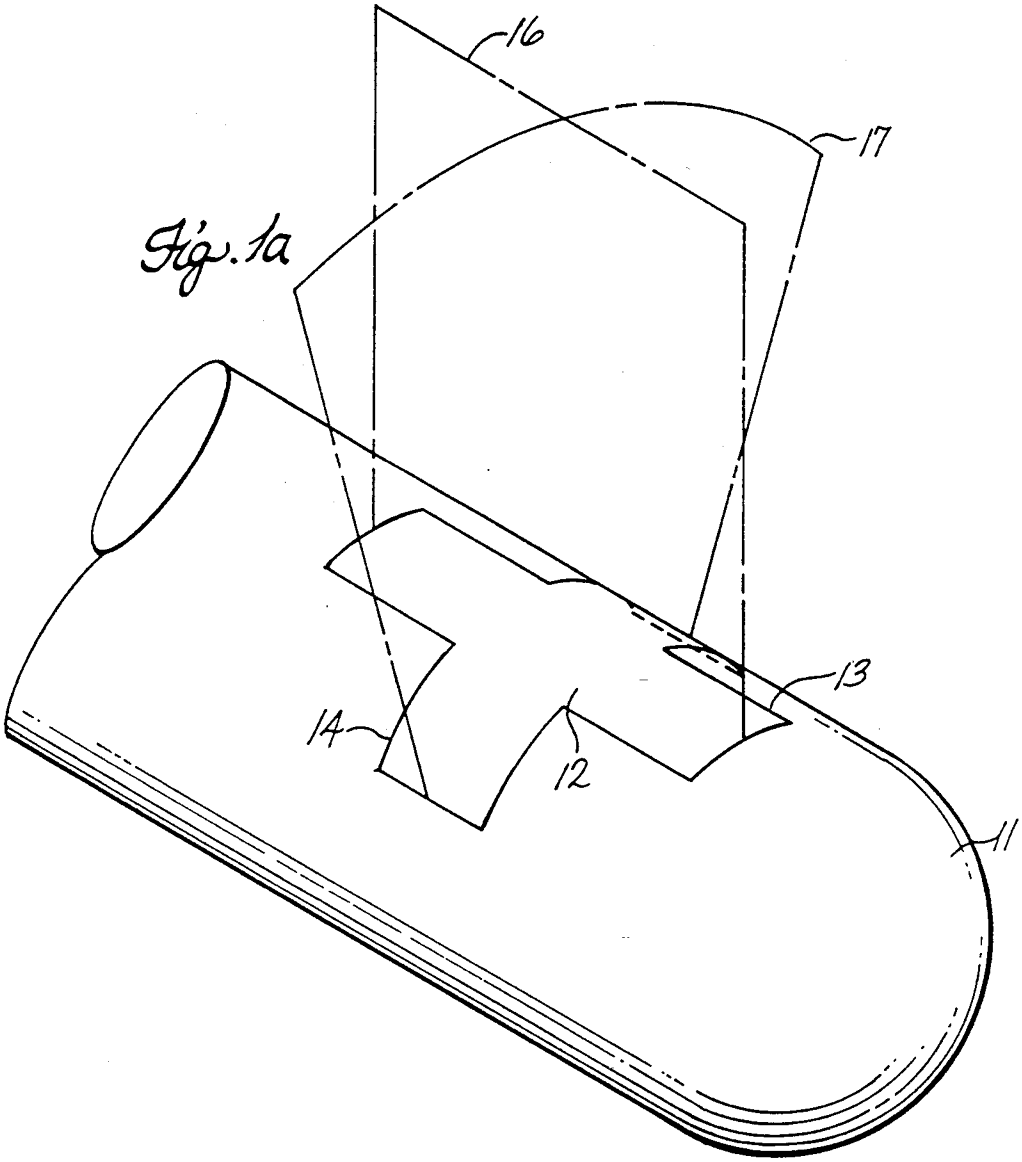
FIG. 1*a* is a perspective view of a fixed biplane transducer of the present invention mounted on a cylindrical probe.
Figure 1B:
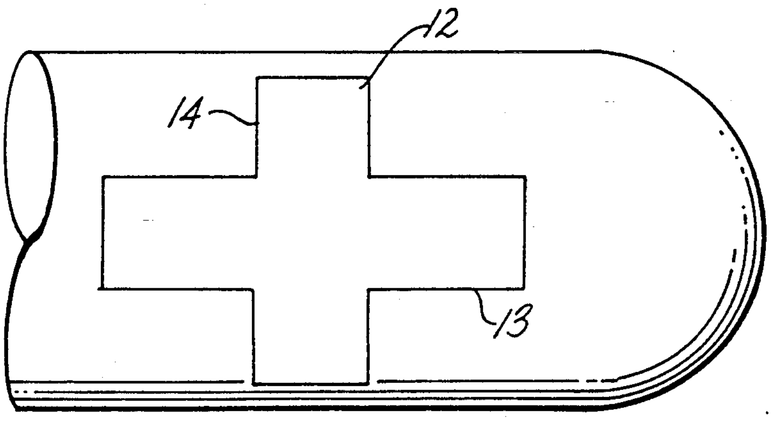
FIG. 1*b* is a plan view of the transducer in FIG. 1*a* of the present invention mounted on a cylindrical probe.

FIGS. 1*a* and 1*b* show a portion of a cylindrically shaped probe 11 with a fixed origin biplane ultrasonic transducer assembly 12 disposed on it. The transducer assembly 12 is positioned such that a straight linear array 13 is aligned along the longitudinal axis of the probe 11. A curved linear array 14 perpendicularly intersects the straight linear array 13 and is disposed along the circumference of the probe 11.

It should be understood, that in the practice of this invention, intersecting array configurations other than the configuration shown in FIGS. 1*a* and 1*b* are used. For example, this invention pertains to a curved linear array which intersects with a second curved linear array. This particular configuration can be implemented on a spherically shaped surface, such as the spherical end of the probe shown in FIG. 1*a*. Further, the linear arrays may be partially straight and partially curved for use on a surface having varying curvature such as where a portion of one of the arrays is on the cylindrical section of the probe 11 and the rest of the array is on the spherical end of the probe. This invention is equally applicable to the use of two straight linear arrays.

Operation of the transducer assembly 12, having a straight and a curved array, produces a rectangular shaped two dimensional image field 16 along the longitudinal axis of the probe and a fan shaped two dimensional image field 17 perpendicular to the rectangular image field 16.

Figure 2:
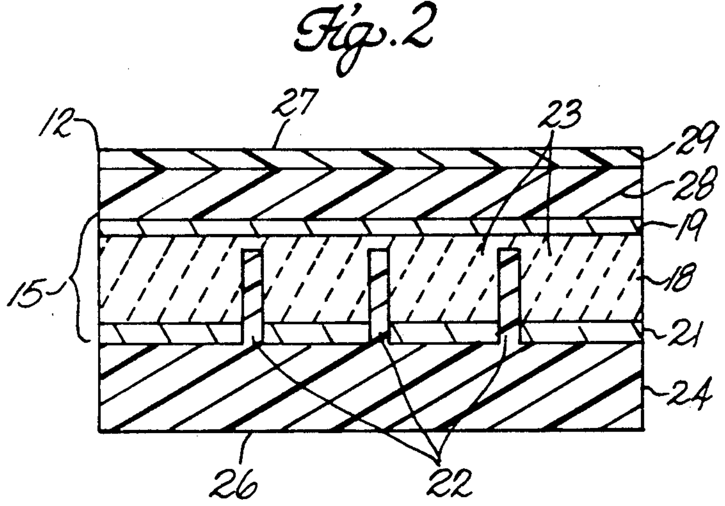
FIG. 2 is a sectional view of an exemplary transducer assembly.

In an exemplary embodiment of the present invention, each of the linear arrays in the transducer assembly 12 comprises a transducer plate 15 wherein piezoelectric 18 material has a ground electrode 19 and a signal electrode 21 disposed on its opposite sides. As illustrated in FIG. 2, grooves 22 are cut into the piezoelectric material, from the side having the signal electrode 21, to produce individual transducer elements 23 each having a separate signal electrode. An epoxy substance is poured into the grooves 22 and allowed to cure thus forming a backing layer 24. The backing layer 24 eventually becomes the lower surface 26 of the transducer assembly 12. On the upper surface 27 of the transducer assembly, from which the ultrasonic energy is emitted, first and second impedance matching layer 28 and 29 are bonded to the ground electrode 19.

All electrical connections are made from the side of the transducer plate 15 having the signal electrode 21. The side of the transducer plate 15 having the ground electrode 19 always faces toward the body (target) when ultrasonic waves are radiated from the transducer assembly 12. The matching layers 28 and 29 have a thickness and impedance chosen to maximize energy transfer into the body.

Accordingly, the transducer plate 15 is always arranged so that the ground electrode 19 is nearer to the upper surface 27 of the transducer assembly 12 than the signal electrode 21. This is a preferred arrangement because having the ground electrode 19 adjacent to the object being scanned reduces the noise level in the resulting image.

Figure 3:
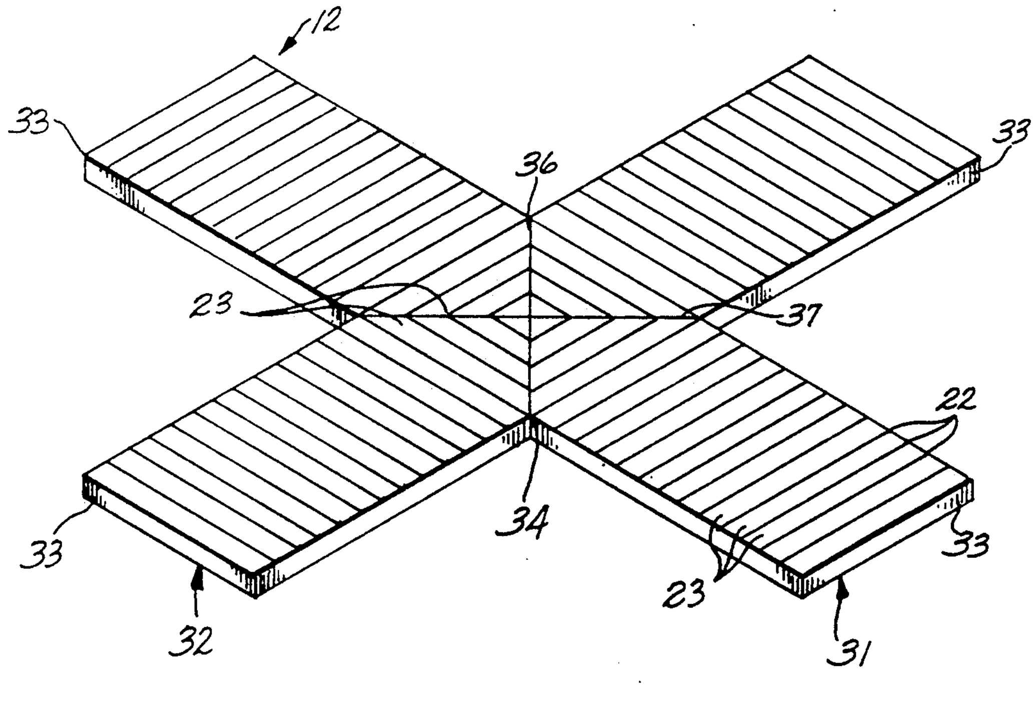
FIG. 3 is a schematic representation of a fixed origin biplane transducer array.

A schematic of an exemplary fixed origin biplane transducer assembly is shown in FIG. 3. In FIG. 3, the fixed origin biplane transducer assembly 12 is shown without the backing layer 24 and the matching layers 28 and 29. As such, the underside of the biplane transducer assembly is shown exposing its signal electrode 21 divided into a plurality of individual transducer elements 23. In this particular embodiment, the transducer assembly 12 has a first straight linear array 31 which intersects a second straight linear array 32 thus forming a cross shaped array having four arms 33 along with an intersecting area 34. Grooves 22 divide each of the linear arrays 31 and 32 into individual transducer elements 23.

In an exemplary embodiment, the biplane transducer assembly is formed with three separate rectangular transducer plate sections. For example, one rectangular transducer plate defines the intersecting area 34 and two opposing arms 33. The other two rectangular transducer plates define the remaining two opposing arms 33.

The grooves 22 in each of the linear arrays 31 and 32 are cut transversely to form transducer elements 23 which extend across the width of the linear arrays. In the intersecting area 34, however, the transducer elements are coaxially positioned. The transducer elements 23 in the intersecting area 34 are electrically separated into four quadrants with diagonal grooves 36 and 37. Each of the diagonal grooves extend from opposing corners of the intersecting area 34. In FIG. 3, the coaxial transducer elements 23 in the intersecting area 34 are square shaped. Other configurations of the intersecting area are possible, as will be discussed below.

Generally, the transducer elements 23 are positioned at equal pitch throughout each of the linear arrays. However, it is not necessary for both of the linear arrays to have the same pitch. Also, there are inconsistencies in pitch, to varying degrees, depending on the pattern of transducer elements in the intersecting area.

Figure 4:
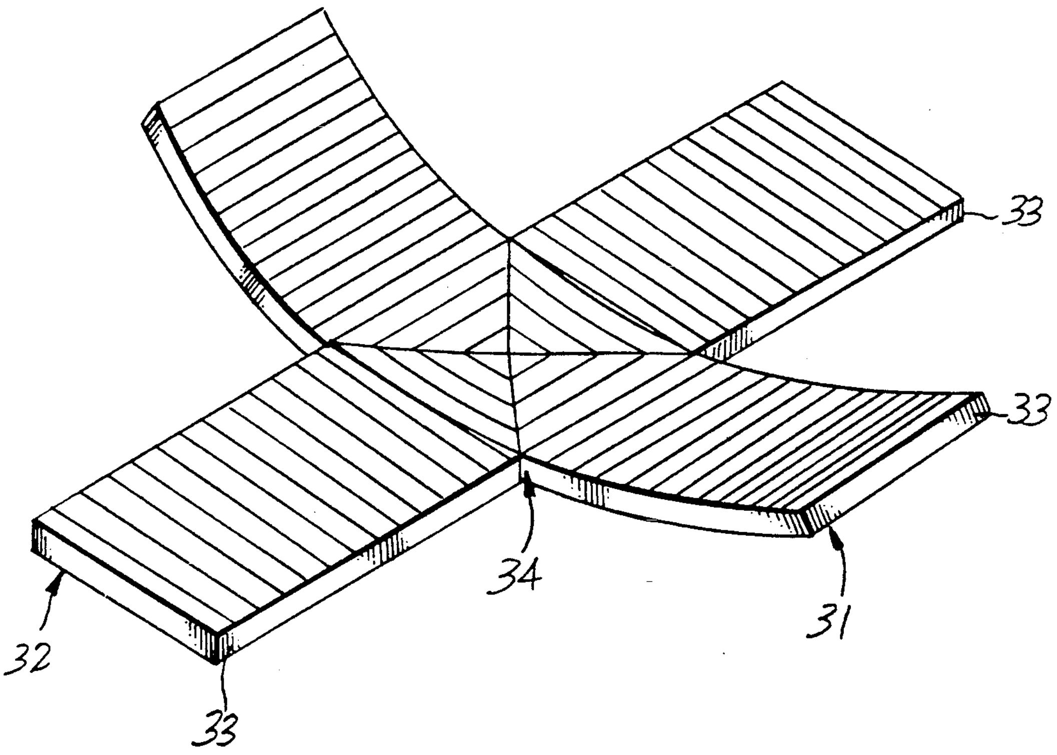
FIG. 4 is a schematic representation of a fixed origin biplane transducer array having a curved linear array.

FIG. 4 shows a schematic diagram of the fixed origin biplane transducer assembly 12 described above wherein the first linear array 38 is curved along its longitudinal axis. The biplane transducer array has transverse elements in each of the arms 33 and coaxial transducer elements in the intersecting area 34 as described immediately above. This configuration allows the fixed origin biplane transducer array to be mounted on a cylindrical probe such as the one illustrated in FIG. 1*a*.

In still another embodiment, not shown in the drawings, each of the first and second linear arrays is curved along its longitudinal axis. This particular configuration allows the fixed origin away to be mounted on a substantially spherical surface.

Remembering that the biplane transducer assembly is formed from three separate transducer plates, it is not critical as to whether the straight linear array or the curved linear array is made from the single transducer plate. For example, in one embodiment, the intersecting area 34 and opposing arms 33 forming the curved linear array 31 are made from a single transducer plate and the other to opposing arms 33 forming the remaining portion of the straight linear array 32 are made from two smaller transducer plates. In a second embodiment, the intersecting area 34 and opposing arms 33 forming the straight linear array 31 are made from a single transducer plate and the other to opposing arms 33 forming the remaining portion of the curved linear array 32 are made from two smaller transducer plates.

Note that all of the signal electrodes for the transducer elements 23 of both arrays are on a common side of the transducer assembly 12. (The opposite side of the transducer has the ground electrodes disposed thereon). Because of this, some accommodation must be made within the intersecting area 34 to provide transducer elements 23 which operate similarly to a conventional linear array. Such accommodation is not required when the transducer elements for the linear arrays are formed on opposite sides of the transducer assembly, as in the prior art, since the transducer elements for each linear array can be formed independently.

Thus, when the transducer elements for each linear array are formed on the same side of the transducer, as in the present invention, the layout of the elements in the intersection area 34 is important.

Figure 5A:
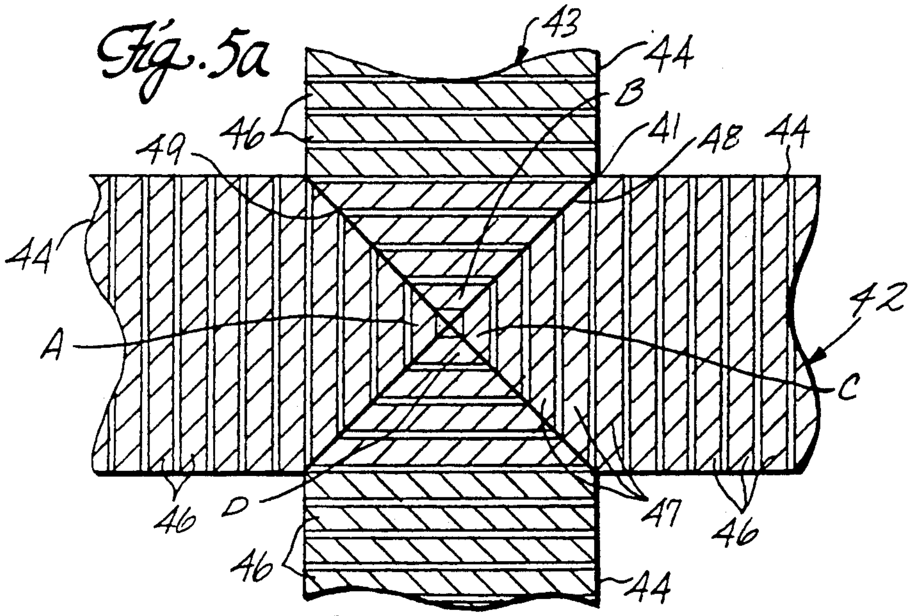
FIG. 5*a* is a detailed plan view of the center section of one embodiment of the present invention wherein the transducer elements are shown with cross hatching.
Figure 5B:
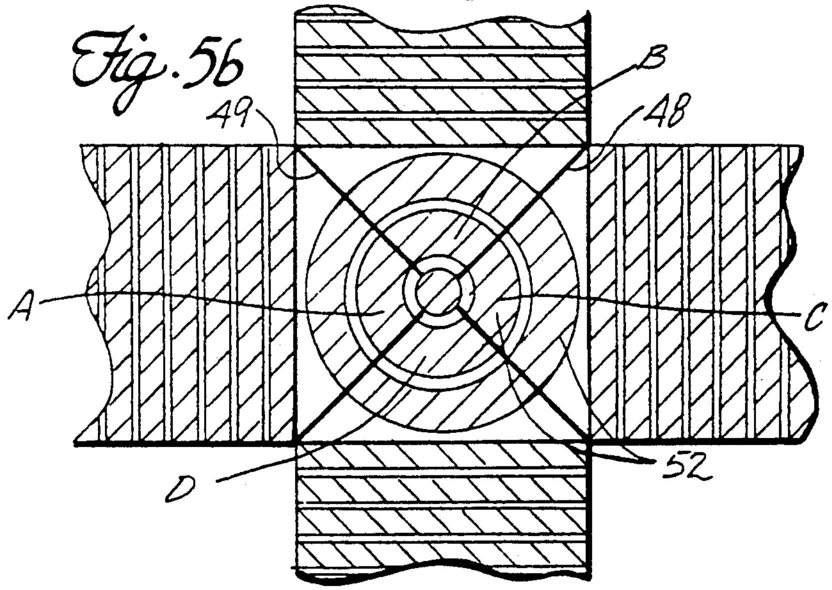
FIG. 5*b* is a detailed plan view of the center section of an alternate embodiment of the present invention wherein the transducer elements are shown with cross hatching.
Figure 5C:
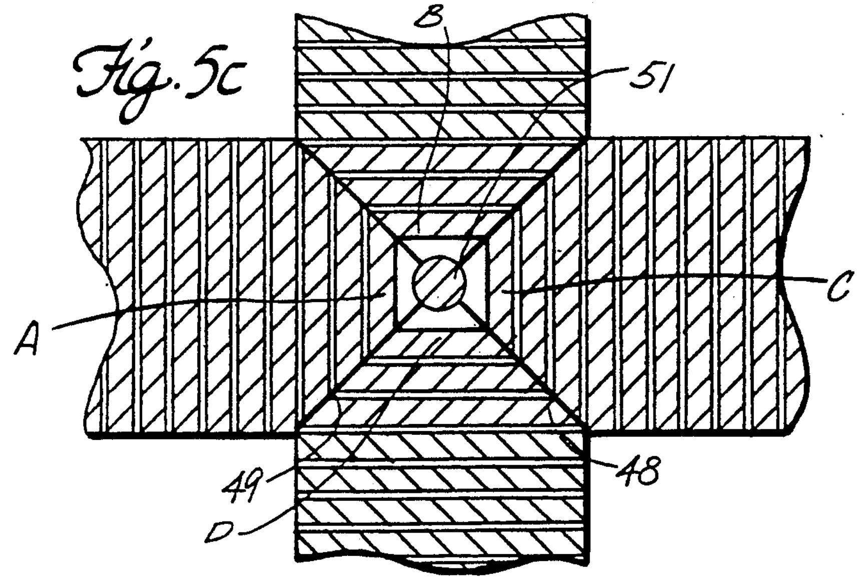
FIG. 5*c* is a detailed plan view of the center section of another alternate embodiment of the present invention wherein the transducer elements are shown with cross hatching.

Schematic diagrams of exemplary layouts for the intersecting area of the present invention are shown in FIGS. 5*a*, 5*b* and 5*c*. In FIG. 5*a*, the intersecting area 41 between a first linear array 42 and a second linear array 43 is shown. The arms 44 of each of the linear arrays 42 and 43 have a series of parallel transverse transducer elements 46. The intersecting area 41 has a series of square shaped coaxial transducer elements 47 separated into four triangular shaped quadrants by diagonal grooves 48 and 49. Although only four rings of co-axial transducer elements are shown in FIG. 5*a*, in an exemplary embodiment, shown best in FIG. 14, the intersecting area 41 has approximately eight coaxial transducer elements within its boundary.

The transducer elements 46 are of a constant size and shape in the arms 44. That is, the transducer elements 41 are of uniform width (having a width equal to the transverse dimension of the arms 44) and are spaced apart at uniform pitch. However, once in the intersecting area, the width of the coaxial transducer elements 47 become increasingly smaller as they approach the center of the intersecting area 41. The pitch of the transducer elements, including the elements in the intersecting area 41, is preferably uniform along the length of each of the linear arrays 42 and 43, including the intersecting area. (Although FIGS. 5*a*, 5*b* and 5*c* show each of the linear arrays having substantially equal pitch, this is preferred, but not required.) In other words, regardless of the varying width of the coaxial transducer elements 47 in the intersecting area 41, the thickness (measured along the longitudinal direction of the transducer array) of each transducer element 47 is the same and the distance between successive elements 47 is the same along each of the linear arrays 41 and 42.

The only point along each of the linear arrays 41 and 42 where the constant pitch of the transducer elements is broken is at the center of the intersecting area 41. When operating the transducer array, this inconsistency in pitch creates an inconsistency in the aperture. However, this first inconsistency is minimized where large apertures are used. Also, the delay lines and software focusing methods are customized to eliminate the inconsistency.

A second inconsistency arises due to the changing surface area of the coaxial transducer elements 47 throughout the linear arrays 41 and 42. It is desired that the sensitivity of the transducer is substantially uniform across the entire array. The sensitivity of each element depends, in large part, on the surface area of the element, and to some degree, on the shape of the element. Smaller elements have lower sensitivity than the larger elements. Generally, sensitivity decreases when the electrical driving impedance of the array elements rises. Specifically, the electrical driving impedance of the transducer array elements rises as the transducer elements 47 get smaller. In order to achieve a substantially constant electrical impedance, groups of the smaller transducer elements 47 are activated in unison. The number of transducer elements 47 in the activated group depend upon the relative size of the transducer elements 47. For example, each of the four transducer elements 47 in the smallest coaxial square shaped ring of transducer elements 47 (i.e. the four transducer elements 47 nearest the center of the intersecting area) could be activated together regardless of which of the two linear arrays is being used. Alternatively, two of the transducer elements 47 in the smaller rings of transducer elements could be activated together, i.e., adjacent elements A and B or opposite elements A and C.

The objective is to select transducer elements for activation in unison in such a combination as to maintain an approximately constant electrical driving impedance for each group of transducers driven in unison. The same principle applies to the other elements in the intersecting area, the larger transducer elements 47 either being activated alone or in unison with one or two other transducer elements 47 in its corresponding coaxial ring of transducer elements 47 depending on its position in the intersecting area 41.

FIG. 5*b* illustrates an alternate embodiment of the intersecting area. Coaxially positioned toroid shaped transducer elements 52 are formed in the intersecting area by cutting annular grooves in the transducer array. As in the previous example, diagonal grooves extending from opposite corners of the intersecting area divide the coaxial transducer elements into four quadrants, each being associated with one of the arms of the biplane transducer array.

Operation of a transducer array having this configuration is more complicated since the pitch between transducer elements along each of the linear arrays is different throughout the entire intersecting area rather than just in the center of the intersecting area. However, adjustments in software correct for these inconsistencies.

FIG. 5*c* shows a modification of the intersecting area 41 shown in FIG. 5*a*. A circular element 51 is located in the center of the intersecting area 41. Two of the inner coaxial transducer elements are removed to make room for the circular element 51. The diagonal grooves 48 and 49 separating the coaxial transducer elements 47 into quadrants do not intersect the piston. The piston helps to cure the inconsistency caused by the break in constant pitch at the center of the square shaped coaxial transducer element pattern. Further, in an exemplary embodiment, the surface area of the circular element 51 is nearly the same as the surface area of the transducer elements in the arms of the array. Because of its shape, the sensitivity of the circular element is generally higher than the sensitivity of a rectangular element having equal surface area. Thus, substantial uniform sensitivity can be achieved across the array with a circular element having a smaller surface area.

Fixed origin biplane transducer assemblies having intersecting areas as described above perform remarkably similarly to conventional arrays. For example, the sensitivity of variation in either of the linear arrays forming the fixed origin biplane transducer assembly is ±2 dB.

Figure 6:
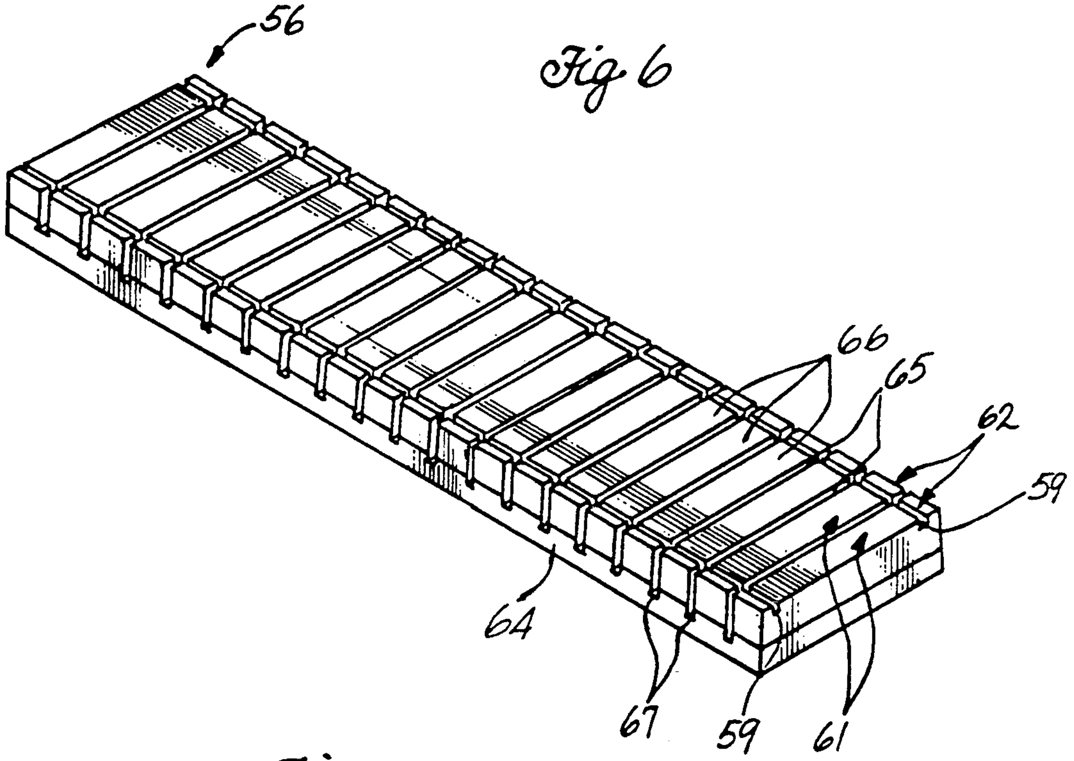
FIG. 6 is a perspective view of an exemplary linear transducer array.

The linear and curved linear transducer arrays which comprise the fixed origin biplane transducer assembly of the present invention can be manufactured by a variety of methods. An exemplary fixed origin biplane transducer, assembly is formed according to the following steps. As illustrated in FIG. 6, a first linear array 56 is formed wherein a rectangular strip of piezo material 57 having a substantially rectangular cross-section is completely encased in metallization such that the piezo material 57 is surrounded on all sides by conductive material 58 thus forming a transducer plate comprised of piezo-electric material. Next, two longitudinal grooves 59 are cut along the upper side of the transducer plate, thus forming two grooves in the transducer plate running along its length. Each groove 59 is deep enough to cut entirely through conductive material 58. Accordingly, two isolated conductive areas, a signal electrode 61 and a ground electrode 62, are formed.

In an alternate embodiment, the piezo electric material used to construct the transducer plate has a curved rectangular cross section 63 as shown in FIG. 9*b* and the grooves are cut in the convex side of the transducer plate.

The signal electrode 61 is formed along the upper surface of the transducer plate as shown in FIGS. 6 to 8, 9*a* and 9*b*. The ground electrode 62 is formed along the other surfaces (bottom and sides) of the piezo material. The longitudinal grooves 59 are cut such that the ground electrode 62 slightly wraps around to the upper surface of the transducer plate. This provides access to both the signal electrode 61 and the ground electrode 62 along the same surface of the plate. A flexible support plate 64 is bonded to the transducer plate along one longitudinal edge of the transducer plate. In an exemplary embodiment, the support plate 64 comprises the first matching layer 28. In the embodiment described above, the support layer is bonded to the edge opposite the upper surface of the transducer plate to allow access to the signal electrode 61 and to the small portion of the ground electrode 62 which wraps around to the upper surface of the transducer plate.

The transducer plate is then cut into segments from the top surface of the transducer plate to form an array of individual transducer elements 66. When a curved linear array is to be formed, each transverse groove 65 extends into the support plate 64 leaving a portion of the support plate 64 uncut thus creating hinge points 67 in the assembly, as illustrated in FIG. 6. The hinge points 67 allow the transducer array to be bent into an arc. The particular radius of the arc depends on the application in which the transducer will be used. Alternatively, the transverse grooves 65 do not extend into the support layer 64 when a straight linear array is to be formed. The transducer plate is cut into segments by means of a conventional semiconductor dicing saw.

When the strip of piezo-electric material is cut into segments to form the individual transducer elements, the ground electrode 62 and signal electrode 61 of each transducer element 66 are completely isolated from the electrodes of the other transducer elements 66. Once the linear array 56 is formed to the desired radius, the ground electrode 62 of each transducer element 66 is connected by soldering each of two ground bus wires 67 along the top edges of the linear array 56 (the ground bus wires are not shown in FIGS. 6 to 8, however they are shown in FIGS. 9*a* and 9*b*). The wires 67 run along the top surface of the piezo-electric material in the areas where the ground electrode 62 of each transducer element 66 wrap around to the upper surface of the linear array 56. The ground bus wires 67 are connected to each of the transducer elements thus forming a ground plane common to all of the elements.

Figure 7:
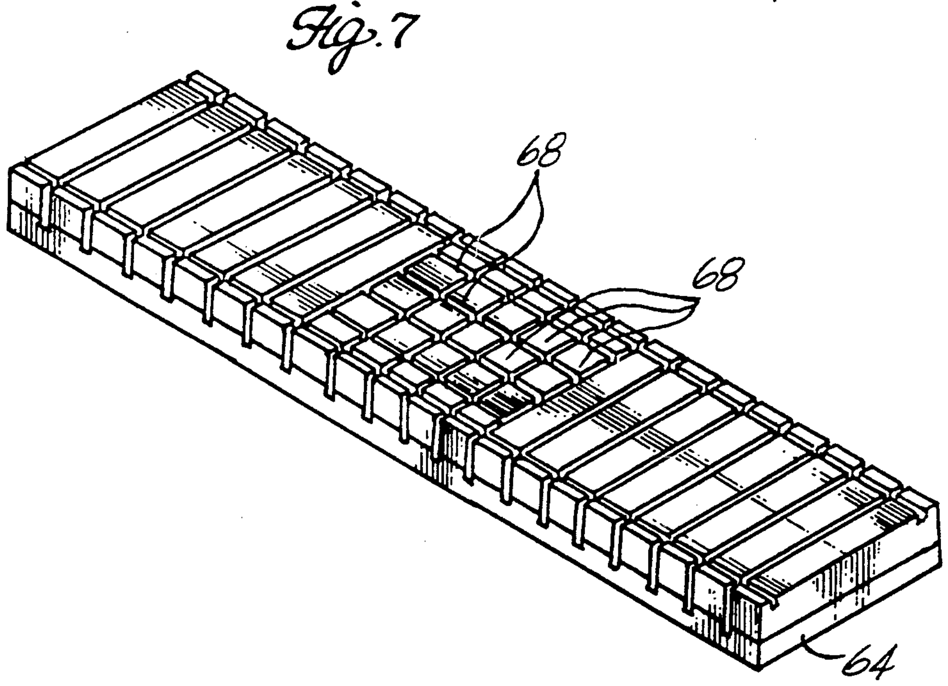
FIG. 7 is a perspective view of the linear transducer array shown in FIG. 6 having diced sub-elements.

As shown in FIG. 7, the intersecting area is formed on the upper surface of the first linear array 56. Longitudinal grooves 68 are cut in the linear array 56 at an intermediate point along the first linear array 56 thus forming a checkerboard of subelements 69 in the intersecting area. The longitudinal grooves are positioned only in the area which will become the intersecting area of the biplane transducer assembly. The dimension of the subelements 69 in the longitudinal direction equal the thickness of the transducer elements formed in the first linear array. The dimension of the subelements 69 in the transverse direction equal the thickness of the transducer elements which will be formation the second linear array.

The second linear array is completed by dicing two smaller rectangular transducer plates in the manner described above and placing them adjacent to the intersecting area located on the first linear array 56. The ground electrodes of each of the branches and the first linear array are bussed together to form a common ground electrode.

Figure 8:
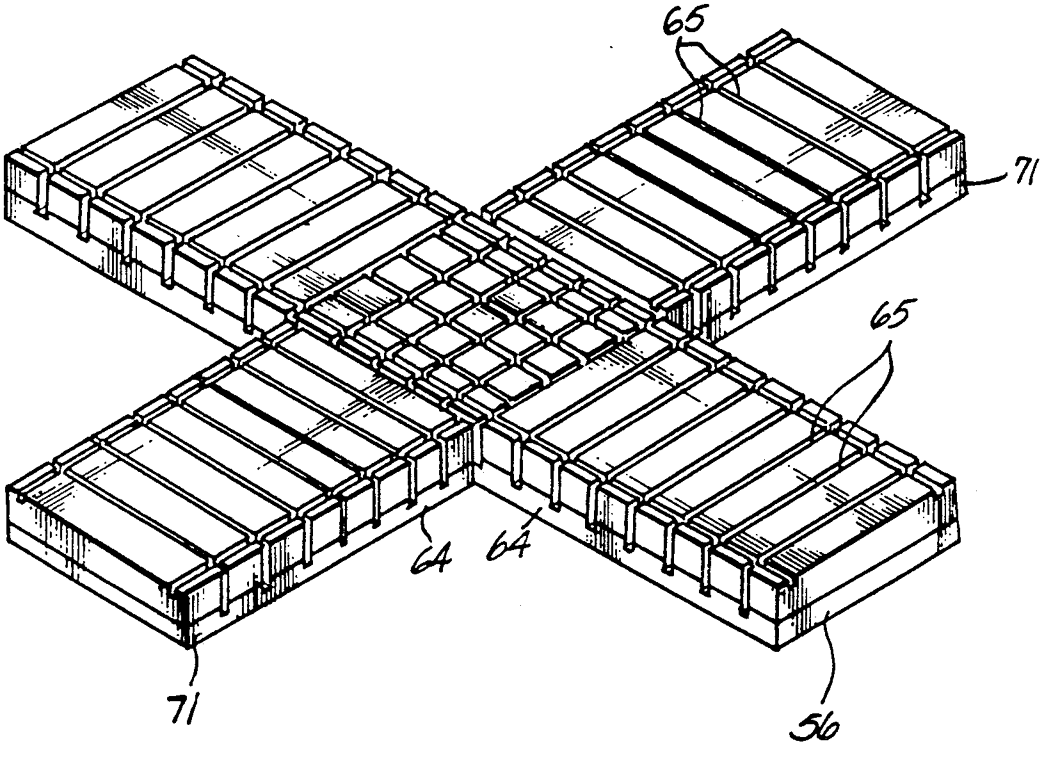
FIG. 8 is a perspective view of an exemplary fixed origin biplane transducer array.

FIG. 8 shows an exemplary embodiment wherein the first linear array 56 is made from a single transducer plate and the second linear array 71 is made from two separate transducer plates along with an intersecting portion of the first linear array 56. In the embodiment shown in FIG. 8, the transverse grooves 65 separating each of the linear arrays 56 and 71 into transducer elements 66 extend into the support layer 64. Thus, either or both of the linear arrays 56 and 71 can be curved such that the upper surface of the linear arrays will become the concave surface of the biplane transducer assembly and the support plate will become the convex surface.

Figure 10:
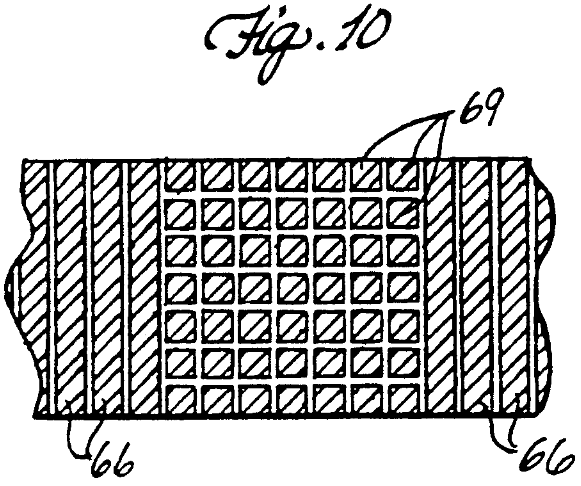
FIG. 10 is a plan view of the center section of the biplane transducer array showing a checkerboard matrix wherein transducer subelements are shown with cross hatching.

The coaxial transducer elements in the intersecting area are formed from the checkerboard of transducer subelements 69 in the intermediate section of the first linear array 56. FIG. 10 shows a plan view of the subelements 69 (the grounds along the edges of the array are not shown).

Figure 11:
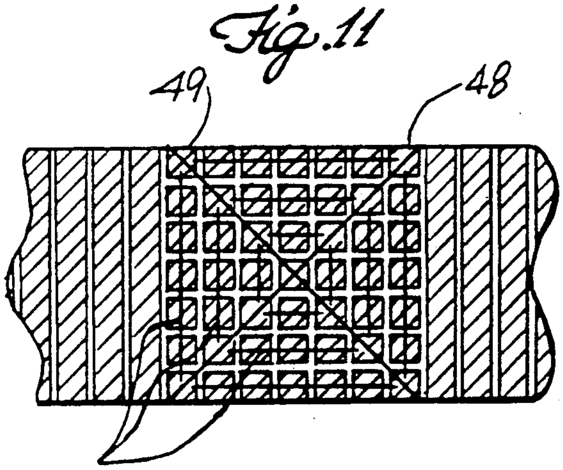
FIG. 11 is a plan view of the center section of the biplane transducer array showing how the checkerboard matrix is bussed together to form square shaped coaxial transducer elements.

To form the element design having the square shaped coaxial transducer elements as shown in FIG. 11, individual subelements are bussed together, using bus wires 72 within each of the quadrants formed by the diagonal grooves 48 and 49. Since the subelements are already rectangularly disposed to each other no additional cutting of the array is necessary.

Figure 12:
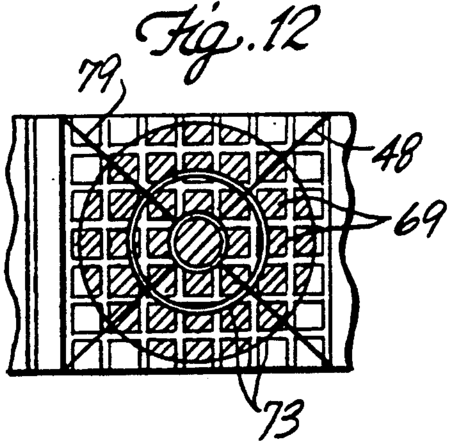
FIG. 12 is a plan view of the center section of the biplane transducer array showing how the checkerboard matrix is bussed together to form toroid shaped coaxial transducer elements.
Figure 13:
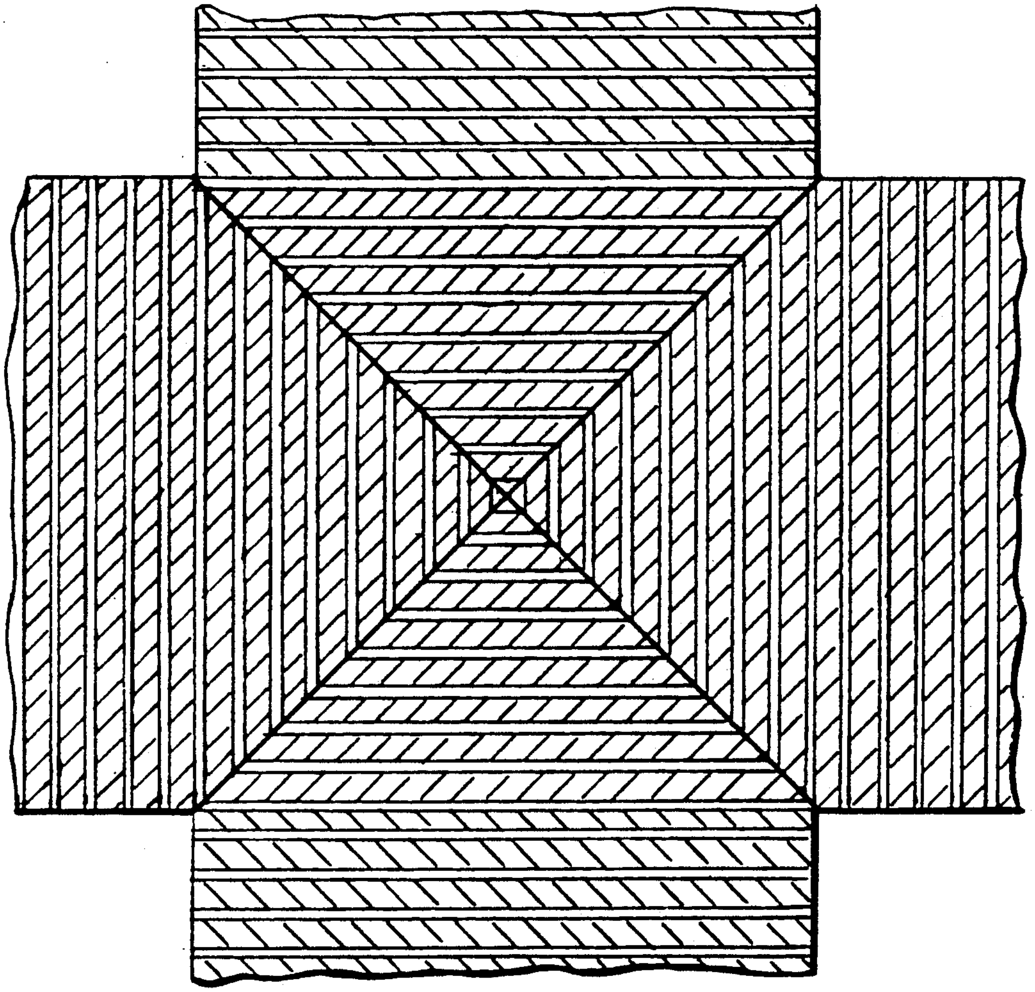
FIG. 13 is a detailed plan view of the center section of one embodiment of the present invention wherein eight sets of co-axially positioned transducer elements are shown with cross-hatching.

However, to form the annular design of FIG. 12, additional annular grooves 73 must be cut in the intersecting area. The result is an annular design superimposed on a checkerboard of subelements 69. The transducer elements are formed by bussing together portions of the subelements 69 which fall within each toroid shaped area bounded by the annular grooves 73 and the diagonal grooves 48 and 49. Since the diagonal grooves 48 and 49 electrically separate the toroid shaped elements, the bus wires do not extend across the diagonal grooves.

In an exemplary embodiment, both the diagonal 48 and 49 and the annular grooves 73 are made in the transducer plate prior to the formation of the subelements 69. Further, the annular grooves only extend down into the linear array to electrically isolate the signal electrodes.

Figure 14:
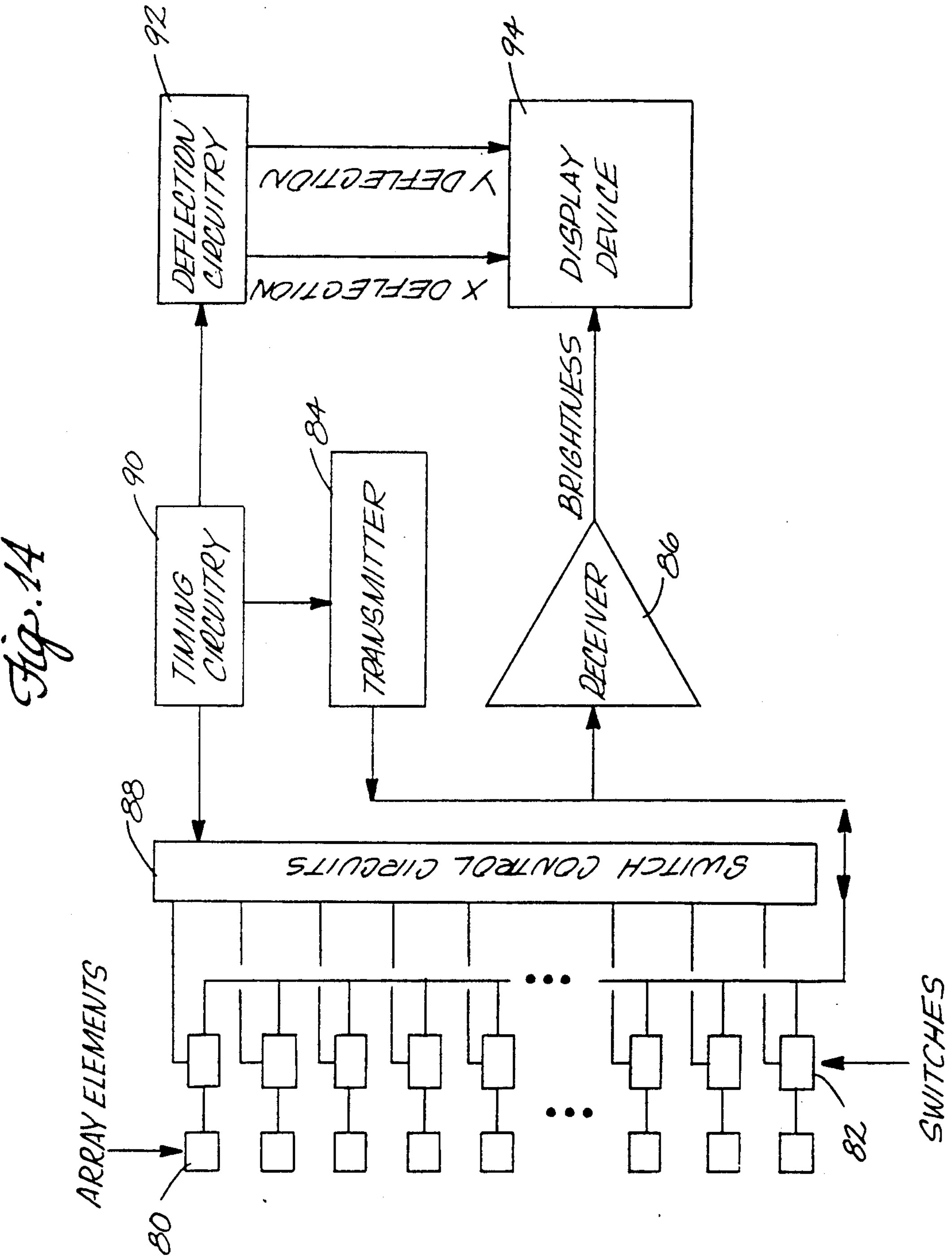
FIG. 14 is a schematic diagram of the electronic circuitry for driving the transducer and processing the echoes returned to the transducer.

FIG. 14 shows the described fixed biplane transducer in an ultrasonic imaging system. The elements 80 of the two arrays are coupled by respective switches 82 to a transmitter 84 and a receiver 86. Switches 82 are actuated by programmed switch control circuitry 88 under the control of timing circuitry 90 to connect the elements of the operating array in the desired groups, sequence, and order. Timing circuitry 90 also controls deflection circuitry 92 for a display device 94. Receiver 86 is coupled to display device 94 to modulate the brightness of its beam, which is scanned under the control of deflection circuitry 92.

The preceding description has been presented with reference to the presently preferred embodiment of the present invention shown in the drawings. Workers skilled in the art and technology to which this invention pertains will appreciate that alterations and changes in the described structures can be practiced without departing from the spirit, principles and scope of this invention.

Accordingly, the foregoing description should not be read as pertaining only to the precise structure described, but rather should be read consistent with, and as support for, the following claims.

What is claimed is:

1. An ultrasonic transducer comprising:

an elongated cylindrical probe;

a crossed shaped plate of piezo material mounted on the surface of the probe, the plate having first and second straight in line arms that extend along the length of the probe, third and fourth curved in line arms that extend around the probe, and an intersecting area between the arms the intersecting area being straight in the direction of the first and second arms and curved in the direction of the third and fourth arms;

a ground electrode plate disposed on one side of the piezo electric material;

a first plurality of signal electrodes disposed on the first and second arms of the opposite side of the piezo electric material; and a second plurality of signal electrodes disposed on the third and fourth arms of the opposite side of the piezo electric material; and a third plurality of signal electrodes disposed on the intersecting area of the opposite side of the piezo electric material;

the signal electrodes defining with the piezo electric material and the ground electrode a plurality of individual transducer elements.

2. An ultrasonic transducer as recited in claim 1 wherein each of the individual transducer elements have substantially equal electrical sensitivity.

3. The transducer of claim 1, in which the first, second, and third plurality of electrodes are between the surface of the probe and the piezo electric material and the piezo electric material is between the first, second, and third plurality of electrodes and the ground electrode.

4. The transducer of claim 1, in which the transducer elements on the intersecting area are formed as a checkerboard of subelements.

5. The transducer of claim 1, additionally comprising means for activating the transducer elements in sequential groups having approximately constant driving impedance.

6. An ultrasonic transducer comprising:

a cross shaped plate of piezo electric material having first and second in line arms, third and fourth in line arms, and an intersecting area between the arms;

a ground electrode disposed on one side of the piezo electric material;

a first plurality of signal electrodes disposed on the first and second arms of the opposite side of the piezo electric material;

a second plurality of signal electrodes disposed on the third and fourth arms of the opposite side of the piezo electric material; and a third plurality of signal electrodes disposed on the intersecting area of the opposite side of the piezo electric material;

the signal electrodes defining with the piezo electric material and the ground electrode a plurality of individual transducer elements, the impedance of the transducer elements on the intersecting area being different from that of the transducer elements on the arms;

means for activating the transducer elements in sequential groups having approximately constant driving impedance.

7. An ultrasonic transducer as recited in claim 1 wherein the cross shaped plate of piezo material comprises a first rectangular shaped plate and a pair of intersecting plates.

8. An ultrasonic transducer as recited in claim 7 wherein the cross shaped piezo plate defines four rectangular shaped branches and a substantially square shaped intersecting area.

9. An ultrasonic transducer as recited in claim 8 wherein the grooves in the branches are arranged transverse to the arms thus defining transverse transducer elements and the grooves in the intersecting area are arranged coaxially defining coaxial transducer elements.

10. An ultrasonic transducer as recited in claim 9 wherein the intersecting area is divided into four quadrants by a pair of diagonal grooves extending from opposite corners of the intersecting area, each quadrant thus laying adjacent to one of the four arms, the diagonal grooves dividing each of the coaxial transducer elements into a plurality of transducer subelements of different surface area.

11. An ultrasonic transducer as recited in claim 10 wherein the transverse transducer elements in oppositely positioned arms are positioned at the same pitch.

12. An ultrasonic transducer as recited in claim 11 wherein the transistor subelements located within each quadrant are positioned at an identical pitch as the transverse transducer elements in the corresponding arms.

13. An ultrasonic transducer as recited in claim 12 wherein the coaxial transducer elements are square shaped.

14. An ultrasonic transducer as recited in claim 13 further comprising a circular transducer element located in the center of the smallest square.

15. An ultrasonic transducer as recited in claim 14 wherein the coaxial transducer elements are toroid shaped.

16. An ultrasonic fixed origin biplane transducer comprising:

a cylindrical probe;

a convexly curved transducer array mounted on the probe to substantially follow the curve of the cylinder; and a straight transducer array perpendicularly intersecting the curved transducer array and mounted on the probe in its longitudinal direction.

17. An ultrasonic transducer as recited in claim 16 wherein the straight transducer array has a rectangular cross section.

18. An ultrasonic transducer as recited in claim 16 wherein the straight transducer has a curved cross section.

19. A ultrasonic transducer comprising:

a first rectangular transducer plate;

a second rectangular transducer plate coupled to the first rectangular transducer plate;

a third rectangular transducer plate coupled to the first rectangular transducer plate;

a first series of parallel grooves, each groove cut transversely at equal pitch in the first transducer plate;

a second series of parallel grooves, each groove cut transversely at equal pitch in the second transducer plate;

a third series of parallel grooves, each groove cut transversely at equal pitch in the third transducer plate;

a forth series of parallel grooves in the first transducer plate, each groove cut in the longitudinal direction in the intersecting area between the second and third transducer plates at a pitch equal to the pitch of the second transducer plate forming a matrix of transducer subelements;

a pair of diagonal grooves in the first transducer plate, each perpendicular groove extending diagonally between opposite corners of the area between the second and third transducer plates dividing the area into four quadrants; and a plurality of bus wires, each bus wire connecting a plurality of transducer subelements within each of the four quadrants.

20. An ultrasonic transducer as recited in claim 19 further comprising a third series of grooves coaxially cut into the intersecting area of the transducer plate.

21. An ultrasonic transducer as recited in claim 20 wherein subelements and pieces of subelements between each of the grooves of the third series of grooves are bussed together.

22. An ultrasonic transducer comprising:

an elongated probe;

a cross shaped plate of piezo electric material mounted on the surface of the probe, the plate having first and second in line arms, third and fourth in line arms, and an intersecting area between the arms;

a ground electrode disposed on one side of the piezo electric material;

a first plurality of signal electrodes disposed on the first and second arms of the opposite side of the piezo electric material;

a second plurality of signal electrodes disposed on the third and fourth arms of the opposite side of the piezo electric material; and a third plurality of signal electrodes disposed on the intersecting area of the opposite side of the piezo electric material;

the signal electrodes defining with the piezo electric material and the ground electrode a plurality of individual transducer elements, the transducer elements in the arms having approximately constant impedance and at least some of the transducer elements in the intersecting area having different impedances.

23. The transducer of claim 22, additionally comprising means for activating the transducer elements in sequential groups having approximately constant driving impedance.

24. An ultrasonic transducer comprising:

an elongated probe;

a cross shaped plate of piezo electric material mounted on the surface of the probe, the plate having first and second in line arms, third and fourth in line arms, and an intersecting area between the arms;

a ground electrode disposed on one side of the piezo electric material;

a first plurality of signal electrodes disposed on the first and second arms of the opposite side of the piezo electric material;

a second plurality of signal electrodes disposed on the third and fourth arms of the opposite side of the piezo electric material; and a third plurality of signal electrodes disposed on the intersecting area of the opposite side of the piezo electric material;

the signal electrodes defining with the piezo electric material and the ground electrode a plurality of individual transducer elements, the transducer elements on the intersecting area being formed in concentric bands.

25. The transducer of claim 24, in which the bands are circular.

26. The transducer of claim 24 in which the bands are square.

27. The transducer of claim 24, in which the bands are divided into four quadrants by diagonal grooves.

28. The transducer of claim 24, additionally comprising a single transducer element at the center of the intersecting area.

29. The transducer of claim 28, in which the single transducer element is circular.

30. The transducer of claim 28, in which the single transducer element is square.

31. The transducer of claim 24, in which the transducer elements on the intersecting area are formed in concentric bands.

32. The transducer of claim 21, in which the bands are circular.

33. The transducer of claim 31, in which the bands are square.

34. The transducer of claim 31, in which the bands are divided into four quadrants by diagonal grooves.

35. The transducer of claim 31, additionally comprising a single transducer element at the center of the intersecting area.

36. The transducer of claim 35, in which the single transducer element is circular.

37. The transducer of claim 35, in which the single transducer element is square.

38. The transducer of claim 24, in which the transducer elements on the intersecting area are formed as a checkerboard of subelements.

39. An ultrasonic transducer comprising:

an elongated probe;

a cross shaped plate of piezo electric material mounted on the surface of the probe, the plate having first and second in line arms, third and fourth in line arms, and an intersecting area between the arms;

a ground electrode disposed on one side of the piezo electric material;

a first plurality of signal electrodes disposed on the first and second arms of the opposite side of the piezo electric material;

a second plurality of signal electrodes disposed on the third and fourth arms of the opposite side of the piezo electric material; and a third plurality of signal electrodes disposed on the intersecting area of the opposite side of the piezo electric material;

the signal electrodes defining with the piezo electric material and the ground electrode a plurality of individual transducer elements, the transducer elements on the first and second arms have an equal pitch and in one or more of the transducer elements at the center of the intersecting area having unequal pitch.

40. An ultrasonic transducer as recited in claim 21 wherein the third series of grooves define a plurality of concentric toroid shaped elements.

* * * * *